United States Patent [19]
Veenstra

[11] Patent Number: 6,011,406
[45] Date of Patent: Jan. 4, 2000

[54] ULTRA-FAST CONFIGURATION MODE FOR A PROGRAMMABLE LOGIC DEVICE

[75] Inventor: Kerry Veenstra, San Jose, Calif.

[73] Assignee: Altera Corporation, San Jose, Calif.

[21] Appl. No.: 09/027,402

[22] Filed: Feb. 20, 1998

Related U.S. Application Data

[60] Provisional application No. 60/063,539, Oct. 28, 1997.
[51] Int. Cl.[7] .......................... G06F 7/38; H03K 19/173; H03K 19/177
[52] U.S. Cl. ................................. 326/38; 326/41; 326/40
[58] Field of Search .................................. 326/17, 38, 39, 326/40, 41, 44, 45; 365/189.5, 221, 230.08, 239

[56] References Cited

U.S. PATENT DOCUMENTS

| | | |
|---|---|---|
| 3,473,160 | 10/1969 | Wahlstrom . |
| 4,870,302 | 9/1989 | Freeman . |
| 5,237,219 | 8/1993 | Cliff . |
| 5,761,099 | 6/1998 | Pedersen ............................. 364/716.01 |
| 5,825,197 | 10/1998 | Lane et al. ................................ 326/10 |
| 5,859,542 | 1/1999 | Pedersen .................................... 326/39 |

*Primary Examiner*—Michael Tokar
*Assistant Examiner*—Vibol Tan
*Attorney, Agent, or Firm*—Morrison & Foerster LLP

[57] ABSTRACT

In order to speed loading of a programming structure wherein the programmable elements in a cellular programmable logic integrated circuit (such as a field programmable gate array ("FPGA") or a programmable logic device ("PLD")) are connected in one or more series with switches interposed between elements in the series, switches are enabled and disabled in a systematic pattern to "walk" data from the data source to a targeted programmable element. When a programmable element stores its targeted data, the switch associated with the programmable element is thereafter disabled to prevent changes in the stored data. Incrementally moving data through the series of programmable elements permits the series to reliably carry multiple data items concurrently, thereby speeding the loading process.

14 Claims, 4 Drawing Sheets

ULTRA-FAST CONFIGURATION MODE FOR A PROGRAMMABLE LOGIC DEVICE

CROSS-REFERENCE TO RELATED APPLICATIONS

This application claims the benefit of U.S. Provisional Application, Ser. No. 60/063,539, filed Oct. 28, 1997, titled "Ultra-fast Configuration Mode," and filed by the same inventor as that named herein.

BACKGROUND OF THE INVENTION

1. Field of the Invention

This invention relates to methods and apparatus for programming programmable logic integrated circuits such as field programmable gate arrays ("FPGAs") and many kinds of programmable logic devices ("PLDs").

2. Description of Related Art

Extremely powerful and flexible programmable logic circuit architectures are known as shown, for example, by Pedersen U.S. Pat. No. 5,260,610 and Cliff U.S. Pat. No. 5,260,611, both of which are hereby incorporated by reference herein. These architectures include large numbers of logic modules, each of which is programmable to perform any of several relatively elementary logic functions. An extensive network of conductors is provided for programmably interconnecting these logic modules in order to provide much more complex logic functions. These logic circuits include very large numbers of programmable elements. Each logic module has a substantial number of these elements, and the interconnection network also requires many such elements to produce the desired interconnections between logic modules.

A typical technique for programming the programmable elements in devices of the type described above is to employ shift registers as shown, for example, in Wahlstrom U.S. Pat. No. 3,473,160 and Freeman U.S. Pat. No. 4,870,302. Each shift register stage controls an associated logic or switching element. Programming data is shifted through the shift register or registers until the data desired for controlling each logic or switching element is stored in the shift register stage associated with that element. A disadvantage of this approach is that shift registers are relatively complex and require substantial numbers of conductors for interstage data transfer, clocking, etc. Thus in complex logic circuit structures, the shift register approach to programming may take up excessive space and other resources, and may even become a limiting factor in the design of the device. The testing of shift register programmed devices is also relatively cumbersome because the shift register can only be tested by shifting data all the way through it. If, as is common in very complex logic circuits, the shift registers are long, it may take a relatively long time to shift test data through them.

A more modern technique for programming the programmable elements in devices of the type described above is to employ multiple programming elements connected in a series or chain in which the serial interconnections are controlled by addressable switches as shown in Cliff U.S. Pat. No. 5,237,219.

The programmable elements in the series are programmed one after another starting with the one which is most remote from the data source. This most remote element is programmed by turning on all the programmable element switches and having the data source supply the data desired for storage in the most remote programmable element. Because all of the programmable element switches are on, this data flows through all of the programmable elements to the most remote one. The programmable element switch just upstream from the most remote programmable element is then turned off and the data source supplies the data desired for storage in the second-most-remote programmable element. This data flows through the series of programmable elements to the second-most-remote programmable element. The most remote programmable element is unaffected and continues to store the previously applied data because the programmable switch upstream from it has been turned off. The programmable element switch upstream from the second-most-remote programmable element is now turned off and the data source supplies the data to be stored in the third-most-remote programmable element. This process continues until the desired data has been stored in all of the programmable elements and all of the programmable element switches have been turned off. Any number of series of programmable elements can be programmed at the same time in parallel.

A characteristic of this approach is that the data desired for storage in the programmable element being programmed at a particular instant is allowed time to pass through all programmable elements and switches upstream from the programmable element being programmed before programming of the next programmable element begins. The time it takes data to pass through all the upstream programmable elements adds to the total time required to program the device and amounts to an unproductive delay.

Thus, there has been a need in the art for a method and apparatus for programming a programmable logic circuit, that allows multiple data items to move down a series of programmable elements simultaneously while maintaining their individual integrity.

SUMMARY OF THE INVENTION

These and other objects of the invention are accomplished in accordance with the principles of the invention by connecting multiple programmable elements in a cellular programmable logic integrated circuit in a series or chain in which the serial interconnections are controlled by addressable switches. The first addressable switch in each series is connected to a data source such as one element of a data register. Data from the data source is "walked" down to its targeted programmable element in a repeated sequence of substeps. In the best mode, the sequence of substeps is made up of two substeps operating in the following manner. In a first substep, data from the data source is loaded into the first programmable element, and data from even-numbered programmable elements is loaded into succeeding odd-numbered elements in the series by turning on all addressable switches controlling serial interconnections into the odd-numbered programmable elements in the series. In a second substep, data from odd-numbered programmable elements is loaded into succeeding even-numbered programmable elements in the series by turning on all addressable switches controlling serial interconnections into the even-numbered programmable elements in the series. When data reaches its targeted programmable element, the addressable switch controlling the serial interconnection into the targeted element is thereafter turned off.

The output of the last programmable element in each series may be connected to a test point such as one element of a test register. To test the operation of each series, all of the programmable switches are turned on. If all of the programmable elements in the series are working properly, data from the data source will flow through the series and appear at the test point. This will not happen if any programmable element in the series is defective.

It will be apparent that the above-described methods and apparatus eliminate the need to wait for data to reach its targeted programmable element before introducing data targeted for other programmable elements into the series. Where n is the number of programmable elements in the series, and tee is the time required to load data into a programmable element, use of the inventive concepts can reduce loading time from a number on the order of $n^2 t_{ee}$, to a number on the order of $2nt_{ee}$ (where a data value is moved only as far as the next programmable element in each substep of a two substep implementation). The larger the n, the greater the potential reduction in loading time as the square of n ($n^2$) rapidly outpaces the doubling of n (2n) as n increases.

Further features of the invention, its nature and various advantages will be more apparent from the accompanying drawings and the following detailed description of the preferred embodiments.

DETAILED DESCRIPTION

Figure 1:
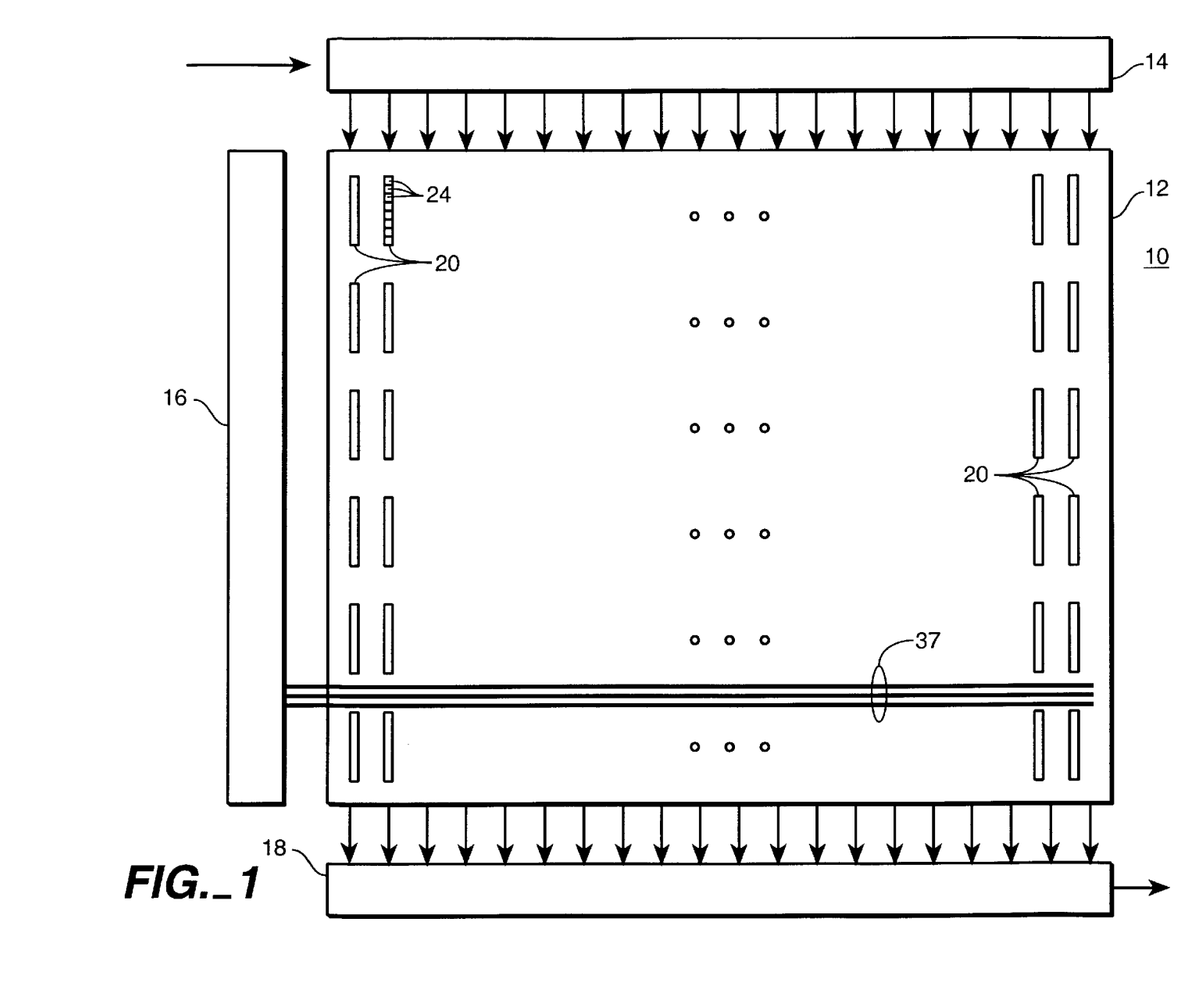
FIG. 1 is a simplified schematic block diagram of an illustrative cellular programmable logic integrated circuit constructed in accordance with the principles of this invention.

FIG. 1 shows a cellular programmable logic integrated circuit 10 of a type shown in above-mentioned Cliff U.S. Pat. No. 5,260,611, with added features in accordance with the present invention. Although this particular type of circuit is shown herein for purposes of illustration, it will be understood that the principles of this invention are equally applicable to a wide variety of programmable logic circuits such as field programmable gate arrays ("FPGAs") and programmable logic devices ("PLDs"), all of which are referred to generically herein as cellular programmable logic circuits.

Circuit 10 includes a main logic portion 12, a data register 14, an address register 16, and a test register 18. Main portion 12 includes 132 logic array blocks or LABs 20 arranged in six rows of 22 LABs per row. Each LAB includes eight logic modules 24. Each logic module can be programmed to perform a desired relatively elementary logic function. For example, each logic module may include a look up table for providing any desired output in response to any one of the 16 possible combinations of four inputs. More complex logic functions can be performed by using a programmable network of conductors (not shown) to interconnect the individual logic modules and LABs in any of a wide variety of ways. More detail regarding the main portion 12 of circuit 10 will be found in the immediately above-mentioned reference, but these details are not necessary for understanding or practicing the present invention. It is sufficient to appreciate that main portion 12 (like many other devices of this general type) has many elements (called function control elements or FCEs in the immediately above-mentioned reference) requiring programming. For example, each of the above-mentioned look up tables has 16 programmable elements. Programmable elements work by storing data values. The stored values each interact with circuitry in circuit 10 to influence some aspect of the overall operation of the circuit. Programmable elements may be used for many purposes throughout the circuit such as programming the interconnections to be made between logic modules 24 and LABs 20, controlling switches within the logic modules and LABs, programming whether logic modules will register or simply pass through data, etc. In a circuit of the size and type described above there could easily be over 300 rows and over 700 columns of programmable elements.

THE PROGRAMMABLE ELEMENT

Figure 2:
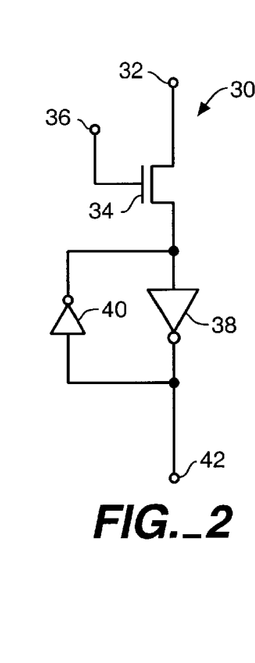
FIG. 2 is a schematic diagram of a programmable element which can be used in the circuit of FIG. 1

FIG. 2 shows a typical programmable element 30 which can be used in circuit 10. Programmable element 30 is a conventional static random access memory or SRAM element that includes input, switch, storage, and (inverting) output circuits. Input data is applied to terminal 32. N-channel transistor 34 acts as a switch that can be turned on by a suitable address signal applied to terminal 36. When transistor 34 is turned on, the data applied to terminal 32 is applied to the input terminal of relatively strong inverter 38. Relatively weak inverter 40, connected in a feedback relationship with inverter 38, is not strong enough to prevent inverter 38 from responding to the data from terminal 32, but is strong enough to maintain inverter 38 in whatever state it is placed by the terminal 32 data when transistor 34 is turned off again. Accordingly, inverters 38 and 40 form a storage circuit enabling programmable element 30 to store the data applied to it. That data is available for output (in inverted form) at terminal 42.

PROGRAMMABLE ELEMENT SERIES

Figure 3:
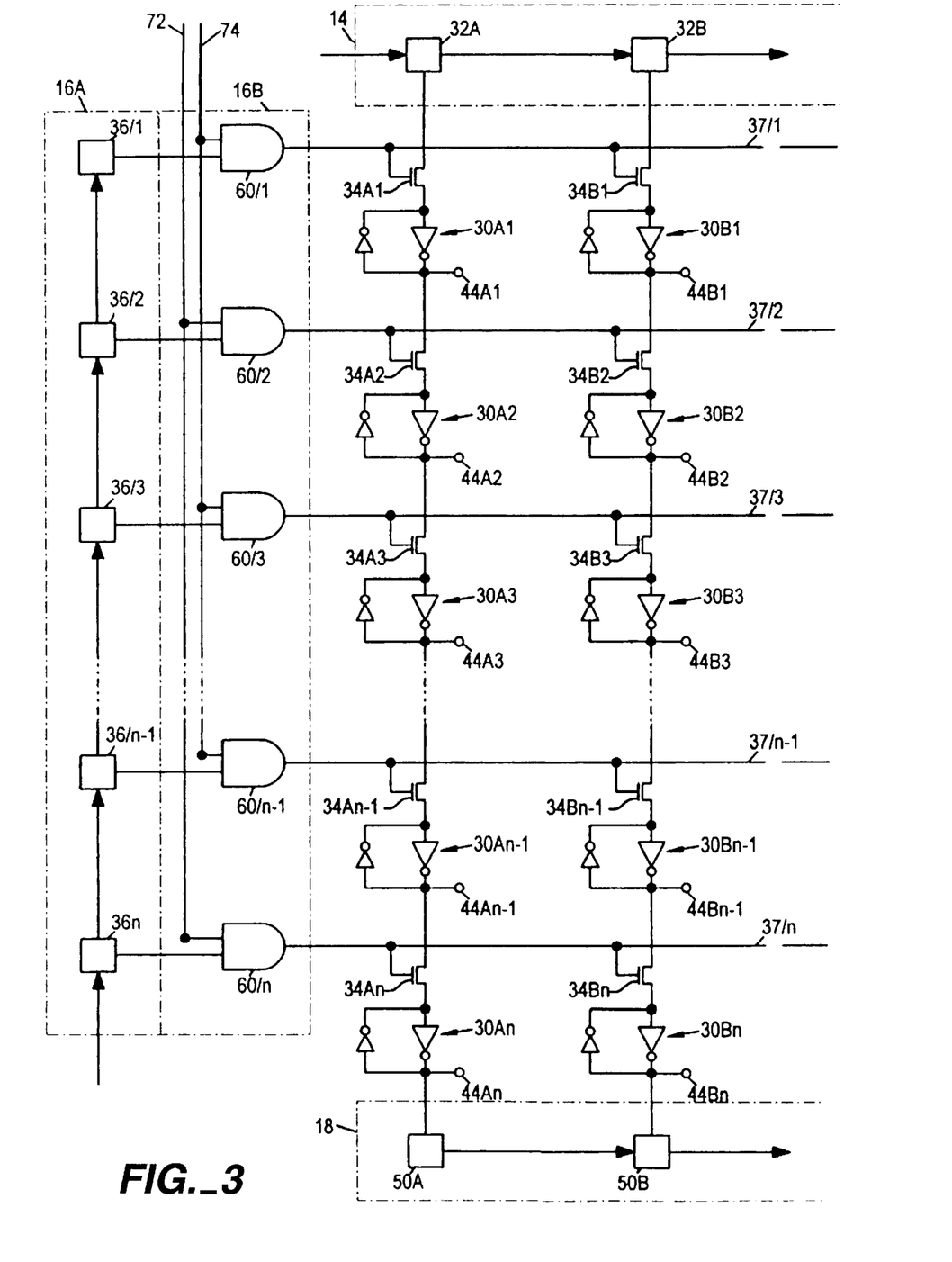
FIG. 3 is a schematic diagram showing how a plurality of programmable elements of the type shown in FIG. 2 can be interconnected and controlled in accordance with this invention.

In order to avoid having to provide a separate data input conductor to each of the large number of programmable elements typically required in field programmable gate array circuits of the type shown in FIG. 1, subsets of these programmable elements are connected in a series or chain as shown in FIG. 3. Two representative series are shown in FIG. 3 with vertical alignment. The first of these series includes data register element 32A, programmable elements 30A1 through 30An, and test register element 50A. The second series includes data register element 32B, programmable elements 30B1 through 30Bn, and test register element 50B. Elements 32 collectively comprise data register 14 in FIG. 1 and, if desired, may form a shift register as suggested by the arrows extending from left to right. Elements 50 collectively comprise test register 18 in FIG. 1 and may also be connected to one another to form a shift register if desired. Address signal combiner 60/1 combines an input signal from address register element 36/1 in a predictable fashion with a second input signal from ODD signal line 74 to produce an address signal on address conductor 37/1. Each of transistors 34 acts as a switch that can either allow or block the transfer of data. All of transistors 34A1, 34B1, etc., are controlled by the signal presented on address conductor 37/1. Address signal combiner 60/2 combines an input signal from address register element 36/2 in a predictable fashion with a second input signal from EVEN signal line 72 to produce an address signal on address conductor 37/2. All of transistors 34A2, 34B2, etc., are controlled by address register element 36/2. This sharing of addressing elements continues to the ends of the series. Elements 36 collectively comprise address register 16A, which may also be a shift register as suggested by the arrows from the bottom to the top in FIG. 3. Address signal combiners 60 collectively comprise address register combiner array 16B. The connection of successive signal combiners in combiner array 16B to ODD signal line 74 and EVEN signal line 72 in alternating fashion continues throughout the series of combiners comprising combiner array 16B. Address register 16A and combiner array 16B collectively comprise address register 16 in FIG. 1. Address register 16A, combiner array 16B, EVEN signal line 72, ODD signal line 74, and address lines 37 collectively comprise the switch controller for the programmable logic circuit.

In the presently described embodiment the use of addressing elements to render a transistor within a programmable element conducting or non-conducting works as follows. A conducting transistor permits a data value to flow into a programmable element; a non-conducting transistor prevents such data flow. Each of transistors 34 is rendered conducting by a data level 1 signal on its corresponding address line, and is rendered non-conducting by a data level 0 signal. Each of signal combiners 60 operates as a logical AND-gate, producing a data level 1 signal at its output (connected to an address line) if, and only if, a data level 1 signal is present on each of its two inputs; otherwise producing a data level 0 signal at its output. If, therefore, by way of example, the address information in address register element 36/1 presents a data level 1 signal to one input of signal combiner 60/1, and ODD signal line presents a data level 1 signal to the other input of signal combiner 60/1, then signal combiner 60/1 presents a data level 1 output signal on address line 37/1 rendering transistors 34A1, 34B1, etc., conducting; otherwise, signal combiner 60/1 presents a data level 0 signal on address line 37/1 rendering transistors 34A1, 34B1, etc., non-conducting.

PRE-LOAD TEST

In typical operation, test data is first loaded into data register 14, and all of transistors 34 are rendered conducting by loading appropriate data into address register 16A and presenting appropriate signals on EVEN signal line 72 and ODD signal line 74 to generate the appropriate signals on all of address lines 37. With all of programmable elements 30A connected in series and all of transistors 34A conducting, the data in data register elements 32A passes through elements 30A to test register element 50A, assuming that all of elements 30A are operating properly. (The data received by element 50A will be inverted if n is odd or uninverted if n is even.) The B series similarly passes data from data register element 32B to test register element 50B. Accordingly, the proper replication of the data register data in test register 18 indicates that programmable elements 30 are operating properly, at least to the extent that they are able to receive and pass on data. If any series of elements 30 is not operating properly to this extent, that will be indicated by the failure of the associated test register element 50 to receive the intended data from the associated data register element 32. Each series of programmable elements 30 may be tested with data of both polarities. If registers 14 and 18 are shift registers, the desired data may be shifted into data register 14 from left to right, and shifted out of test register 18, also from left to right.

DATA LOADING

After testing as described above, data can be stored in programmable elements 30 as will now be described. By activating odd-numbered and even-numbered address lines on an alternating basis, data are made to "walk" down each series of programmable elements 30A, 30B, etc., incrementally. A subsequent data item can be started down each series of programmable elements one "step" behind the earlier data item without waiting for the earlier data item to necessarily arrive at its storage location. At least one non-conducting switch separates adjacent data items at all times as they traverse the series. Such non-conducting or deactivated switches may be referred to as blocking switches because they block the passage of data from the storage circuit of the preceding programmable element into the storage circuit of the programmable element of which they are a part. Because one input data value can quickly follow another, and start moving down the series without necessarily waiting for the prior one to reach its targeted storage location, the total time to load the series can be greatly reduced. This represents an advantage of the present invention.

When a data item arrives at the programmable element where it is to be stored, the address line controlling the programmable element is caused to thereafter maintain the transistor of the programmable element in non-conducting state, thereby preventing further changes to the value stored by the programmable element. Loading in this fashion is accomplished from bottom to top, i.e., data for programmable elements farthest from the data source 30A$n$, 30B$n$, etc., is input first and data for programmable elements closest to the data source 30A1, 30B1, etc., is input last.

FIRST SUBSTEP

Data are stepped down a programmable element series 30A, 30B, etc., by repeated step operations, each comprised of a first substep and a second substep. A first substep proceeds as follows. Appropriate signals are placed on EVEN signal line 72 and ODD signal line 74 to place all transistors 34 in non-conducting state. The data to be stored in the programmable elements farthest from the data source, 30A$n$, 30B$n$, etc., are loaded into data register 14. (FIG. 3 depicts a device where n is an even number, as indicated by a connection from EVEN signal line 72 to signal combiner 60/n. In an embodiment where n is an odd number, the complement of the data to be stored in the farthest programming elements is loaded into data register 14 due to the odd number of inverter stages that the data will pass through before presenting at the output of the $n^{th}$ element.) Address information conducive to placing all of transistors 34A1–34A$n$, 34B1–34B$n$, etc., into a conducting state is stored in address register 16A. An appropriate signal is placed on ODD signal line 74 to place all transistors in programmable elements in odd-numbered positions within their respective series 34A1, 34A3, 34A$n$-1, and 34B1, 34B3, 34$n$-1, etc., into conducting state. At the top of the programmable element array, data from data register elements 32A, 32B, etc., passes through conducting transistors 34A1, 34B1, etc., and is stored in corresponding programmable elements 30A1, 30B1, etc. The data stored in each of programmable elements 30A1, 30B1, etc., is prevented from passing to the immediately succeeding programmable element in its respective series 30A2, 30B2, etc., by non-conducting transistors 34A2, 34B2, etc. For all programmable elements following the first in each series of programmable elements, data is loaded from even-numbered elements in the series 30A2, 30A$n$-2 (not shown), 30B2, 30B$n$-2 (not shown), etc., into any immediately succeeding odd-numbered element 30A3, 30A$n$-1, 30B3, 30B$n$-1, etc., in the respective series through the odd-numbered programmable element's conducting transistor 34A3, 34$n$-1, 34B3, 34$n$-1, etc. Data does not pass from odd-numbered programmable elements 30A1, 30A3, 30A$n$-1, 30B1, 30B3, 30B$n$-1, etc., to immediately succeeding even-numbered elements 30A2, 30A4 (not shown), 30A$n$, 30B2, 30B4 (not shown), 30B$n$, etc., because even-numbered address lines 37/2, 37/4

(not shown), 37/n, etc., maintain a signal appropriate to hold connected transistors in non-conducting state. After a time sufficient to ensure that data storage is successful, a signal is placed on the ODD signal line 74 conducive to placing affected transistors in non-conducting state.

The effect of the preceding steps, in summary, is to load input data from the data register into the first (nearest) programmable elements in each series, and to shift the data stored in even-numbered programmable elements to the succeeding odd-numbered element in its series, if any. This combined operation performs the first "substep" of a data loading step.

SECOND SUBSTEP

A second substep operation proceeds as follows. An appropriate signal is placed on EVEN signal line 72 to place all transistors in programmable elements in even-numbered positions within their respective series 34A2, 34An, and 34B2, 34Bn, etc., into conducting state. For all programmable elements in each series of programmable elements, data is loaded from odd-numbered elements in the series 30A1, 30A3, 30An-1, 30B1, 30B3, 30Bn-1, etc., into any immediately succeeding even-numbered element 30A2, 30A4 (not shown), 30An, 30B2, 30B4 (not shown), 30Bn, etc., in the respective series through the even-numbered programming element's conducting transistor 34A2, 34A4 (not shown), 34An, 34B2, 34B4 (not shown), 34Bn, etc. Data does not pass from even-numbered programmable elements 30A2, 30An-2 (not shown), 30B2, 30Bn-2 (not shown), etc., to immediately succeeding odd-numbered elements 30A3, 30An-1, 30B3, 30Bn-1, etc., because odd-numbered address lines 37/3, 37/n-2 (not shown), etc., maintain a signal appropriate to hold connected transistors in non-conducting state. After a time sufficient to ensure that data storage is successful, a signal is placed on the EVEN signal line 72 conducive to placing affected transistors in non-conducting state.

The effect of the preceding steps, in summary, is to shift the data stored in odd-numbered programmable elements to the succeeding even-numbered element in its series, if any. This operation performs the second "substep" of a data loading step.

COMPLETING THE LOAD OPERATION

To load all of the programmable elements 30, the first substep, second substep sequence described above is performed repeatedly. The data loaded into data register 14 at the beginning of each first substep is the data (or its complement) that is desired to be stored in programmable element positions successively closer to the data source. Upon completion of the $n^{th}$ successive substep, the data desired to be stored by the programmable elements farthest from the data source 30An, 30Bn, etc., arrive at, and are stored by, those programmable elements. Upon completion of the $(n+1)^{th}$ (i.e., n-plus-oneth) successive substep, the data desired to be stored by the programmable elements one position closer to the data source 30An-1, 30Bn-1, etc., arrive at, and are stored by, those programmable elements. After this fashion, each succeeding half step operation stores the desired values in the programmable elements one position closer to the data source.

Upon completion of the $n^{th}$ successive substep, the address line 37/n controlling the transistors 34An, 34Bn, etc., of the programmable elements farthest from the data source 30An, 30Bn, etc., is caused to thereafter place the affected transistors 34An, 34Bn, etc., in non-conducting state to prevent any change to the values stored by the programmable elements 30An, 30Bn, etc. This can be accomplished by loading the corresponding address register element 36n with a value conducive to effect the placement of transistors 34An, 34Bn, etc., into non-conducting state. In the presently described embodiment a data value 0 stored in address register element 36n causes a data value 0 to appear at the connected input of signal combiner 60/n, thereby causing signal combiner 60/n to assert a data value 0 on address line 37/n placing affected transistors 34An, 34Bn, etc., in non-conducting state. Upon completion of the $(n+1)^{th}$ (i.e., n-plus-oneth) successive substep, the address line 37/n-1 controlling the transistors 34An-1, 34Bn-1, etc., of the programmable elements loaded with their targeted data in the just-completed substep 30An-1, 30Bn-1, etc., is caused to thereafter place the affected transistors 34An-1, 34Bn-1, etc., in non-conducting state to prevent any change to the values stored by the programmable elements 30An-1, 30Bn-1, etc. This can be accomplished by loading the corresponding address register element 36n-1 with a value conducive to effect the placement of transistors 34An-1, 34Bn-1, etc., into non-conducting state. In the presently described embodiment a data value 0 stored in address register element 36n-1 causes a data value 0 to appear at the connected input of signal combiner 60/n-1, thereby causing signal combiner 60/n-1 to assert a data value 0 on address line 37/n-1 placing affected transistors 34An-1, 34Bn-1, etc., in non-conducting state. Continuing after this fashion, in each succeeding substep the address line controlling the programmable elements next closest to the data source is caused to thereafter present a signal to render affected transistors non-conducting. The presently described embodiment easily accomplishes this successive disabling with each substep, of progressively closer address lines, described above. At the completion of the $n^{th}$ substep and prior to the start of the subsequent substep, and during the corresponding interval for each substep thereafter, the address register 16A is operated as a shift register, with data moving from the bottom to the top as indicated by the arrows in FIG. 3. A data value 0 presents on the input of address register element 36n for each shift operation.

Loading continues as described above, substep by substep. Programmable elements closest to the data source 30A1, 30B1, etc., are the last to store their desired data. All programmable elements 30 contain their desired data at the completion of the $(2n-1)^{th}$ (i.e., two-n-minus-oneth) substep and the loading operation may be stopped.

LOADING EXAMPLE

Figures 4, 4B:
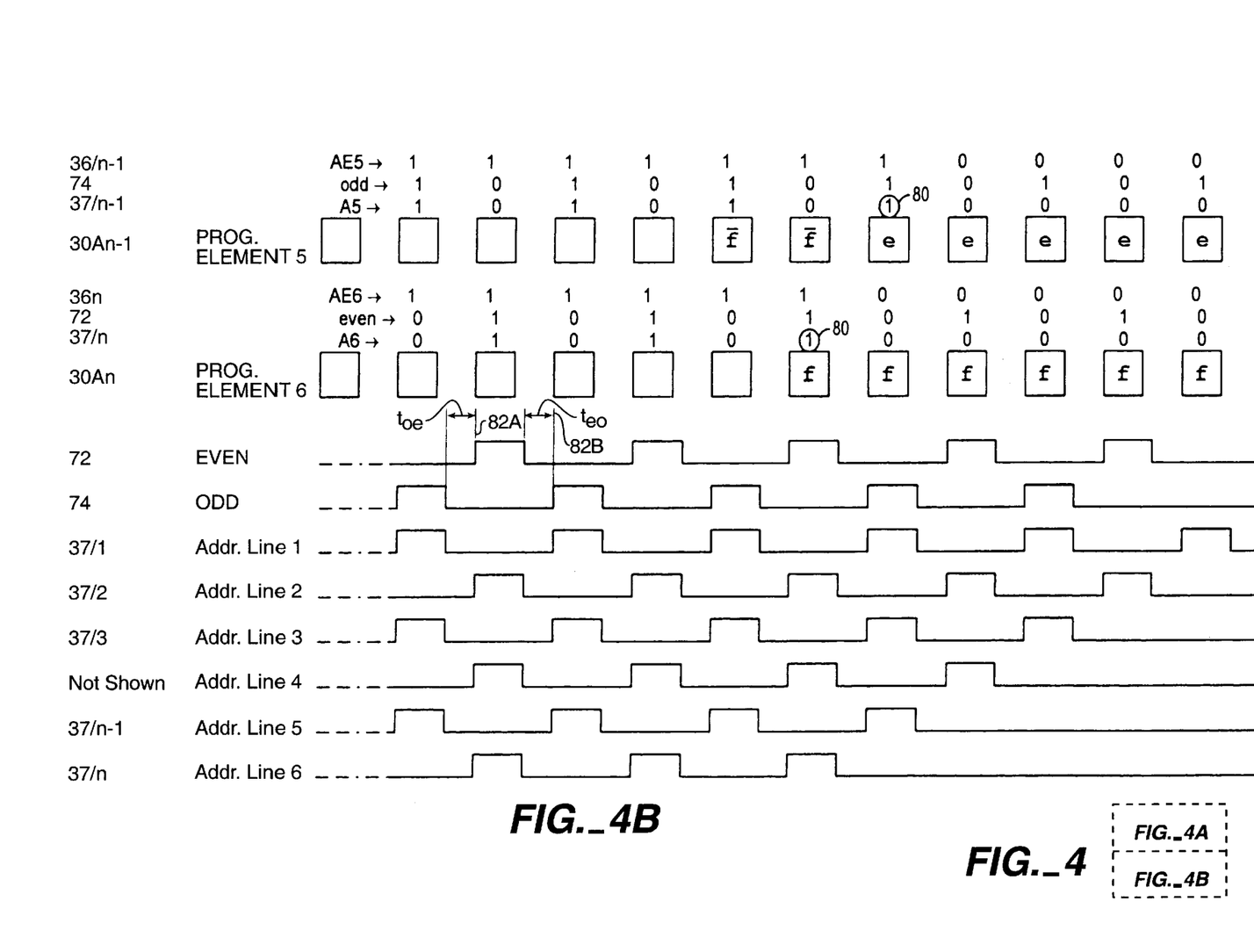
FIG. 4 is a pictorial representation of the loading process described in reference to FIG. 3.
Figure 4A:
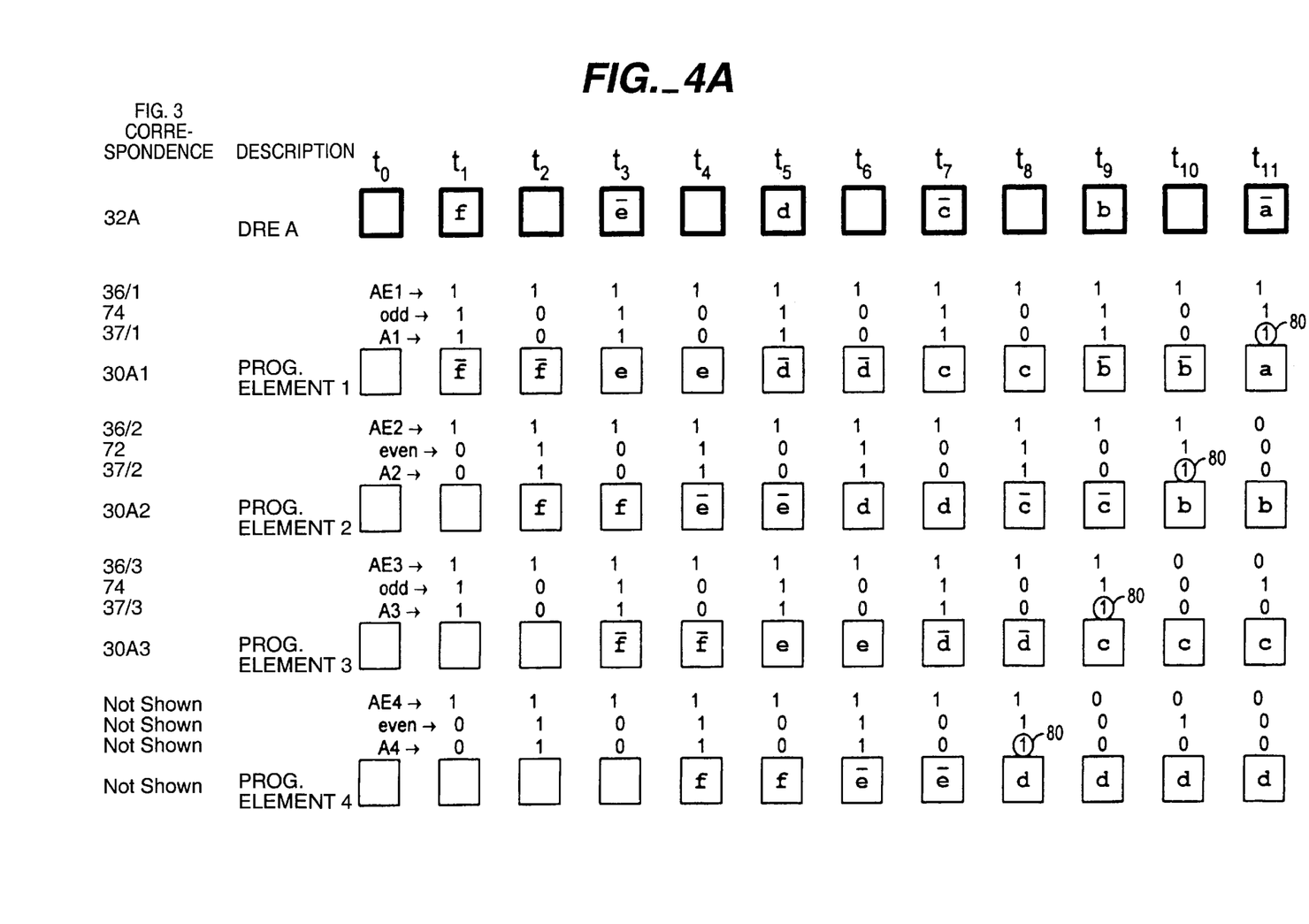

FIG. 4 is a pictorial representation of the loading process described in reference to FIG. 3. In order not to obscure an understanding of the invention with unnecessary detail, the example depicted in FIG. 4 shows the loading of a single series of programmable elements comprised of only 6 elements (n=6), with data values shown as a, b, c, d, e, and f loaded into programmable elements 1, 2, 3, 4, 5, and 6, respectively. A bar appearing over the top of an a, b, c, d, e, or f value indicates the complement of that value. Twelve successive time periods are shown as vertical segments of FIG. 4 and designated $t_0$–$t_{11}$. Time period $t_0$ represents a pre-load state of the device. Time period $t_{11}$ represents the time period wherein the final input data item reaches the programmable element targeted for its storage. Each time period $t_1$–$t_{11}$ represents a time period used to perform a single substep operation. A first row of boxes, designated DRE A, shows the content of a data register element over time, serving as the data source for the series of programmable elements. Empty boxes indicate contents that are inconsequential to the operation of the presently described embodiment. Each of the rows of boxes, designated Prog. Elements 1–6, shows the contents, over time, of one programmable element in the series of programmable elements. Empty boxes indicate contents that are inconsequential to the operation of the presently described embodiment.

Three rows of numbers appear immediately above each row of boxes that depict a programming element, and correspond to that programming element. Each number in a row indicates a characteristic value associated with a respective time period. Each number in the topmost row indicates the characteristic value stored in the address register element affecting the address line that influences the corresponding programmable element. Each number in the middle row indicates the characteristic state of the signal asserting on either the ODD signal line or the EVEN signal line (ODD or EVEN as designated to the immediate left of the middle row of numbers). Each number in the bottommost row of numbers indicates the characteristic state of the signal asserting on the address line that influences the corresponding programming element.

The appearance of a "1" in the bottommost row of numbers corresponds to a signal placing into a conductive state the transistor associated with the corresponding programmable element. The aforementioned transistor is one of the transistors 34 illustrated and discussed in reference to FIG. 3. The appearance of a "1" thus signifies that the transistor allows passage of data from the preceding programmable element in the series to the storage circuit of the present programmable element. The appearance of a "0" in the bottommost row of numbers corresponds to a signal placing into a non-conductive state the transistor associated with the corresponding programmable element. The appearance of a "0" thus signifies that the transistor blocks the passage of data from the preceding programmable element in the series to the storage circuit of the present programmable element.

Representative waveform diagrams appear in FIG. 4 immediately below the rows of boxes that represent programmable elements. For each waveform, a low wave position indicates a signal value of 0, and a high wave position indicates a signal value of 1. The two topmost waveforms represent the states of the EVEN signal line and the ODD signal line over time. The six bottommost waveforms represent the state of address lines 1–6 over time. Time intervals 82 represent non-overlap intervals incorporated into the presently described embodiment to prevent a data value from moving farther down the series of programmable elements than the next immediate programmable element in the series, during any particular substep. Non-overlap intervals also provide an interval in the presently described embodiment during which address register elements can be modified without causing undesired side effects on address line signals. Early stabilization of address register element values is also signified in FIG. 4 by the slight leftward offset of the rows of numbers representing address element contents, relative to the other rows of numbers having the same corresponding programmable element.

Circled numbers 80 in FIG. 4 highlight the final "1" value presenting on each address line. The time period in which a circled number appears is the time period in which the corresponding programming element stores the input data value targeted to it. The diagonal pattern formed by the circled numbers 80 illustrates the progressive turning off of address lines as programmable elements progressively store their targeted data values.

It will be understood that the foregoing is merely illustrative of the principles of this invention, and that various modifications can be made by those skilled in the art without departing from the scope and spirit of the invention. For example, although the invention has been illustrated in the context of a particular cellular programmable logic circuit architecture, it will be understood that the invention is equally applicable to many other types of cellular programmable logic circuits. As another example, a data item may be moved to more than one successive programming element within a single substep. Thus, the foregoing description is not intended to limit the invention which is described in the appended claims in which:

What is claimed is:

1. A programmable logic circuit having programmable elements connected in a series comprising:
   a switch controller to control transfer of data through the series such that data item values targeted to different programmable elements in the series travel simultaneously down the series in response to control signals, and the control signals control the activation state of switches such that always at least one switch is deactivated between data item values traversing the series targeted to different programmable elements.

2. The programmable logic circuit of claim 1 wherein said switch controller simultaneously activates and deactivates switches in the series in an alternating pattern.

3. The programmable logic circuit of claim 2 wherein the switch controller further comprises:
   a plurality of address lines; and
   an address register having a plurality of address register elements, each of said address register elements controlling a respective one of said address lines.

4. The programmable logic circuit of claim 3 wherein the switch controller further comprises a signal combiner array coupling said address register elements to said plurality of address lines.

5. The programmable logic circuit of claim 4 wherein said address register elements are connected to one another so as to form an address shift register.

6. The programmable logic circuit of claim 3 wherein said address register elements are connected to one another so as to form an address shift register.

7. The programmable logic circuit of claim 1 wherein the switch controller further comprises:
   a plurality of address lines; and
   an address register having a plurality of address register elements, each of said address register elements controlling a respective one of said address lines.

8. The programmable logic circuit of claim 7 wherein the switch controller further comprises a signal combiner array coupling said address register elements to said plurality of address lines.

9. The programmable logic circuit of claim 8 wherein said address register elements are connected to one another so as to form an address shift register.

10. The programmable logic circuit of claim 7 wherein said address register elements are connected to one another so as to form an address shift register.

11. A method for programming a programmable logic circuit having programmable elements connected in a series, the steps comprising:
   (a) storing a first data item value in the storage circuit of a first programmable element;
   (b) activating one or more switches such that said first data item value transfers to the storage circuit of a second programmable element downstream from said first programmable element;
   (c) deactivating a switch located in the series between the storage circuits of said first and said second programmable elements;

(d) storing a second data item value in the storage circuit of said first programmable element while said switch deactivated in step (c) remains deactivated.

12. The method of claim 11, the steps further comprising:

(e) preventing reactivation of said switch deactivated in step (c) after the storage circuit of said second programmable element stores the data item value targeted for storage therein.

13. The method of claim 11 wherein said second programmable element is the next downstream programmable element from said first programmable element.

14. The method of claim 12 wherein said second programmable element is the next downstream programmable element from said first programmable element.

* * * * *